United States Patent [19]

Schöberl

[11] 4,143,394

[45] Mar. 6, 1979

[54] SEMICONDUCTOR LUMINESCENCE DEVICE WITH HOUSING

[75] Inventor: Werner Schöberl, Massenbachhausen, Fed. Rep. of Germany

[73] Assignee: Licentia Patent-Verwaltungs-G.m.b.H., Frankfurt am Main, Fed. Rep. of Germany

[21] Appl. No.: 817,518

[22] Filed: Jul. 20, 1977

[30] Foreign Application Priority Data

Jul. 30, 1976 [DE] Fed. Rep. of Germany ....... 2634264

[51] Int. Cl.² ...................... H01L 23/28; H01L 33/00
[52] U.S. Cl. ........................................ 357/72; 357/17; 313/500; 313/512
[58] Field of Search ............................. 357/17, 72, 30; 313/500, 512

[56] References Cited

U.S. PATENT DOCUMENTS

| 3,555,335 | 1/1971 | Johnson ................................. 357/17 |
| 3,639,770 | 2/1972 | Zizelmann ............................. 357/72 |
| 3,694,902 | 10/1972 | Apgar et al. .......................... 357/17 |
| 3,883,772 | 5/1975 | Wako et al. ........................... 357/17 |
| 4,047,075 | 9/1977 | Schoberl ............................... 357/72 |

Primary Examiner—Andrew J. James
Attorney, Agent, or Firm—Spencer & Kaye

[57] ABSTRACT

A semiconductor luminescence component comprises a light emitting element in a light transmitting casing, the casing having internal surfaces for total internal reflection for light rays emitted laterally by the light emitting element.

12 Claims, 3 Drawing Figures

U.S. Patent
Mar. 6, 1979
4,143,394
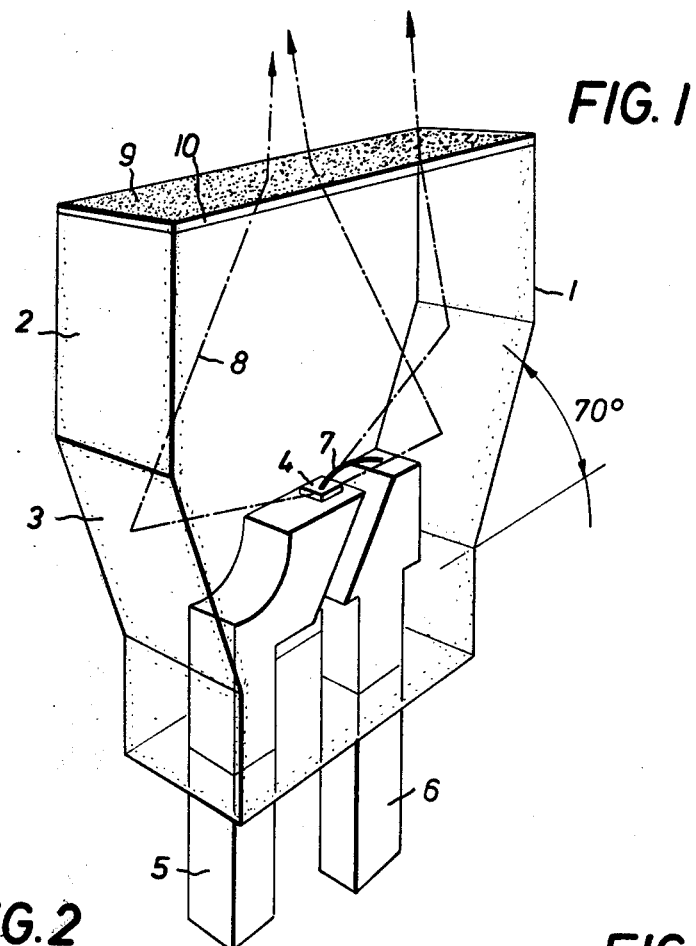
FIG. 1
FIG. 2
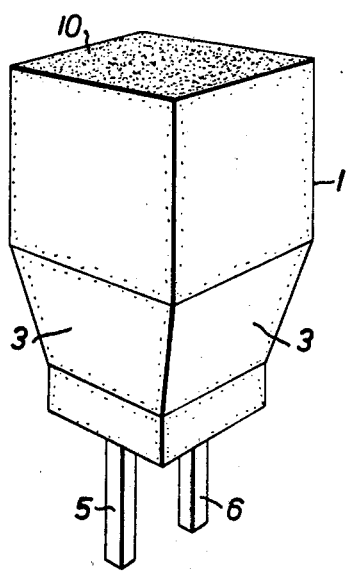
FIG. 3

SEMICONDUCTOR LUMINESCENCE DEVICE WITH HOUSING

BACKGROUND OF THE INVENTION

The invention relates to a semiconductor luminescence component with a light-transmissive casing. This type of component, which is formed usually by light-emitting diodes, is already known. The light-emitting diode is cast in a plastic body which serves as a photoconductor and has substantially the same cross-section over its entire length. The end face of this casing body remote from the semiconductor component serves as a light outlet surface, which is to be illuminated as well and as evenly as possible.

SUMMARY OF THE INVENTION

It is an object of the invention to provide a semiconductor luminescence component in which, as far as possible, all of the light emitted by the semiconductor component is visible evenly distributed over a relatively large light outlet surface.

According to the invention, there is provided a semiconductor luminescence component comprising a semiconductor light emitting element, a light transmitting casing for said semiconductor component defining surfaces providing total internal reflection for light rays from said semiconductor element laterally thereof.

Further according to the invention, there is provided a semiconductor luminescence component having a light-transmissive casing characterized in that the casing wall runs, in its lower casing part, at such an angle to the light rays escaping laterally from the semiconductor component and falling on the casing wall, that the light falling there is reflected back into the casing in a direction towards the casing end serving as a light outlet surface.

BRIEF DESCRIPTION OF THE DRAWINGS

The invention will now be described in greater detail, by way of example, with reference to the drawings, in which:

FIG. 1 is a perspective view of a semiconductor luminescence component in accordance with the invention;

FIG. 2 is a perspective view of a different form of component in accordance with the invention, and FIG. 3 is a perspective view of yet another form of component.

DESCRIPTION OF THE PREFERRED EMBODIMENTS

In a preferred form of the invention in a semiconductor luminescence component with a light-transmissive casing, it is proposed that the lower casing part of the casing wall runs at such an angle to the rays of light originating laterally of the semiconductor component and meeting on the casing wall, that the light meeting there is reflected back into the casing in a direction towards the end of the casing serving as a light outlet surface.

In one embodiment of the casing the light rays emanating laterally from the semiconductor body, in the manner described, no longer emanate from the casing, but are reflected back by means of total reflection in the interior of the casing to the light outlet surface. This means that loss of light resulting from the escape of parts of the light at the side faces of the casing is either completely or partially avoided and thus a large degree of efficiency of the light-emitting diode is ensured.

The semiconductor casing may be constructed in different ways. As an example, the casing is plate shaped in its upper part and has a constantly rectangular cross-section. The casing narrows at its lower part, at least at two opposite side faces, by an angle which is selected so that the light rays meeting these faces are reflected back into the inside of the casing in a direction towards the light outlet surface.

In a very narrow plastics casing, as is required for the purpose of forming illuminating lines, the two narrow sides of the casing wall will preferably run at an angle of approximately 70° to the surface, in the lower part of the casing, carrying the semiconductor component.

In another embodiment the casing may be constructed so as to be square in its upper part in which the edges of the casing are substantially of equal length. With this casing shape, the lower part of the casing, on which the rays of light originating laterally of the semiconductor component fall, will preferably be tapered in pyramid shape.

Furthermore, the casing may be cylindrical in its upper part with constant circular or eliptical cross-section. In its lower part the casing is then tapered conically, whereby the angle and beginning of the tapering is selected at the casing sleeve surface such that the light rays originating laterally of the semiconductor component, which would otherwise penetrate the casing wall and thus be lost, are reflected back into the inside of the casing. The angle of tapering is preferably 70° with respect to the plate or surface carrying the semiconductor component.

The casing preferably comprises polycarbonate or epoxy resin and contains 1 to 5% powdered glass for the purpose of improving illumination. The light outlet surface is provided with a fine structure or is roughened in order to achieve even illumination. The remaining casing sleeve surfaces, particularly the sleeve surfaces, which serve for the purpose of reflecting light rays, are very smooth however.

In another embodiment a thin diffusing lens may be set on the end of the casing serving as a light outlet surface, the diffusing lens dividing the light up evenly. Then it is sufficient if powdered glass is incorporated only into the diffusing lens. Furthermore, it is possible to tint either the glass disc only or the entire casing body with colour pigments in order to improve the contrast. A further increase in light output may be achieved if the light outlet surface is convexly curved in the shape of a lens. The diffusing lens may be shaped so that it has an outer flange by which it is mounted on the casing of the luminescence component or with which it may be tensioned.

Referring now to the drawings, FIG. 1 shows the semiconductor body 4 of the light emitting diode fixed to the end of a supply pin 5. At the same time, one region of the semiconductor component is connected to this supply pin 5 so as to be electrically conductive. The second region of the semiconductor component is connected so as to be electrically conductive, via a thin contacting wire 7, to the end face of a further contact pin 6 which runs parallel to the supply pin 5. The casing of the light-emitting diode is shaped like a plate and surrounds the ends of the supply pins 5 and 6 as well as the semiconductor component 4 with the supply wire 7. The casing comprises polycarbonates or epoxy resin, for example, and has a rectangular cross-section. Accordingly the casing has two large outer surfaces lying parallel to each other. The two narrow sides 2 of the casing also run parallel to each other at the part of the casing bordering the light outlet surface 10. At the height of the component and in a part lying thereabove, these side surfaces 3 are angled so that the rays of light 8 originating laterally from the semiconductor component 4 are reflected at the smooth wall 3 and are deflected to the light outlet surface 10. The angle by which the side surfaces 3 are inclined in the lower part of this casing body is approximately 70° to the surface carrying the semiconductor body. The light outlet surface is formed by the end of the casing body remote from the semiconductor component. In order to obtain a uniform distribution of light, this end 10 is roughened or is slightly structured on its surface. On the other hand a diffusion plate 9 may be set on the end face 10, the diffusion plate ensuring uniform distribution of light on the surface. The diffusing lens 9 contains 1 to 5% powdered glass for better distribution of light as well as colour pigments for increasing contrast. If the diffusing lens 9 is to be dispensed with, the particles of the powdered glass may be distributed in the casing body 1 in the stated concentration, with the casing body also preferably being tinted with colour pigment for the purpose of increasing the contrast.

A casing body 1 is shown in FIG. 2 which is square in its upper part and for example has a square cross-section. With this type of casing, all four side surfaces 3 may be tapered off in the lower part so that the light falling on these surfaces is reflected back into the square casing body. The lower casing part tapers preferably in pyramid shape whereby the inclination of the side surfaces 3 is approximately 70°. The point of transition between the square part of the casing 1 and the pyramid-shaped casing part must be selected so that the largest possible part of the light escaping laterally from the semiconductor body 4, which light runs parallel or at a small angle only to the bearing surface of the semiconductor body, is reflected back to the light outlet surface 10. Thus it is ensured that as little light as possible escapes through the side surfaces of the casing and thus is lost in terms of light output.

Another embodiment is shown in FIG. 3 in which the upper casing part is cylindrical. This casing part has a constant cross-section which is circular or eliptical. The lower casing part 3 tapers conically in a downward direction whereby the tapering angle is again approximately 70°. The point of transition between the casing part 1 and the casing part 3 is selected so that the largest possible proportion of the light emitted laterally by the semiconductor body is reflected on to the end light outlet surface of the luminescence semiconductor component.

With the embodiment of the casing body of a light-emitting diode in accordance with the invention it is possible to illuminate, in a unidorm manner, relatively large rectangular, square or round illuminating surfaces, which are formed by the ends of the casing body. With one embodiment a good illuminated surface of the size 10 × 10 mm can be obtained. The advantage of the arrangement in accordance with the invention lies in the fact that no special metalisation or reflecting coating need be applied to the reflecting wall surfaces. The reflection takes place in the present case at the border layer of plastics to air by means of total internal reflection.

What is claimed is:

1. In a semiconductor luminescence component including a light-transmissive casing having an end surface serving as a light outlet surface, and a semiconductor light-emitting element cast in said casing opposite said light outlet surface, the improvement wherein said casing has an upper casing part adjacent said light outlet surface followed by a lower casing part in which said semiconductor element is located; wherein said upper casing part has a constant cross section; and wherein the side wall of said casing extends, in said lower casing part, at such an angle to the light rays escaping laterally from the semiconductor element and falling on the casing side wall, that the light falling there is reflected back into the casing in a direction towards said casing end surface serving as a light outlet surface.

2. A component as defined in claim 1, wherein said casing has the shape of a plate in its upper part with a constant rectangular cross-section, and tapers in its lower part at least at two opposite side surfaces by an angle which is selected such that the meeting rays of light falling thereon are reflected back into the interior of the casing in a direction towards said light outlet surface.

3. A component as defined in claim 2, wherein said casing comprises two narrow sides running at an angle of approximately 70° to a surface carrying said semiconductor component in said lower casing part.

4. A component as defined in claim 1, wherein said casing comprises a square upper part and a tapered pyramid shaped lower part.

5. A component as defined in claim 1, wherein said casing comprises a cylindrical upper part and a conically tapered lower part.

6. A component as defined in claim 5, wherein said lower part of said casing tapers conically at an angle of approximately 70°.

7. A component as defined in claim 1, wherein said casing comprises a polycarbonate or an epoxy resin and contains 1 to 5% powdered glass for improving illumination.

8. A component as defined in claim 1, wherein said light outlet surface is roughened and said remaining casing surfaces are very smooth.

9. A component as defined in claim 1 and comprising a thin diffusing lens roughened at the surface, arranged on the end of said casing and containing powdered glass and colour pigments for the purpose of improving contrast.

10. A component as defined in claim 1, wherein said light outlet surface is convexly curved in the shape of a lens.

11. A component as defined in claim 1, and comprising a diffusing lens with an outer flange for mounting said lens on said casing.

12. A component as defined in claim 1 wherein the side walls of said casing are smooth and said casing is formed of a plastic material such that the side walls define surfaces providing total internal reflection for impinging rays from said semiconductor element without the need for an external reflective coating.

* * * * *